US008853019B1

(12) United States Patent  (10) Patent No.: US 8,853,019 B1
Fronheiser et al.  (45) Date of Patent: Oct. 7, 2014

(54) METHODS OF FORMING A SEMICONDUCTOR DEVICE WITH A NANOWIRE CHANNEL STRUCTURE BY PERFORMING AN ANNEAL PROCESS

(71) Applicant: GLOBALFOUNDRIES Inc., Grand Cayman (KY)

(72) Inventors: Jody A. Fronheiser, Delmar, NY (US); Jeremy A. Wahl, Delmar, NY (US); Kerem Akarvardar, Saratoga Springs, NY (US); Ajey P. Jacob, Albany, NY (US); Daniel T. Pham, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 51 days.

(21) Appl. No.: 13/798,616

(22) Filed: Mar. 13, 2013

(51) Int. Cl.
  *H01L 29/94* (2006.01)
  *H01L 29/66* (2006.01)
  *B82Y 40/00* (2011.01)

(52) U.S. Cl.
  CPC .......... *H01L 29/66477* (2013.01); *B82Y 40/00* (2013.01)
  USPC .................... 438/176; 438/283; 257/E21.623

(58) Field of Classification Search
  USPC .................. 438/176, 283, 157; 257/E21.623, 257/E21.637
  See application file for complete search history.

(56) References Cited

U.S. PATENT DOCUMENTS

| 7,235,436 B1 | 6/2007 | Lin et al. |
| 7,981,736 B2 | 7/2011 | Juengling |
| 8,034,689 B2 | 10/2011 | Lenoble et al. |
| 8,076,231 B2 | 12/2011 | Saitoh et al. |
| 8,159,018 B2 | 4/2012 | Akil et al. |
| 2009/0242964 A1* | 10/2009 | Akil et al. ..................... 257/324 |
| 2009/0294839 A1 | 12/2009 | Doyle et al. |
| 2010/0155827 A1 | 6/2010 | Kim et al. |
| 2010/0164102 A1 | 7/2010 | Rachmady et al. |
| 2011/0012201 A1 | 1/2011 | Yagishita et al. |
| 2011/0084336 A1 | 4/2011 | Luning et al. |

(Continued)

OTHER PUBLICATIONS

Ang et al., "Effective Schottky Barrier Height Modulation using Dielectric Dipoles for Source/Drain Specific Contact Resistivity Improvement," IEDM12-439-442, 18.6.1-18.6.4, 2012.

(Continued)

*Primary Examiner* — Thanhha Pham
(74) *Attorney, Agent, or Firm* — Amerson Law Firm, PLLC

(57) ABSTRACT

One method disclosed herein includes forming a layer of silicon/germanium having a germanium concentration of at least 30% on a semiconducting substrate, forming a plurality of spaced-apart trenches that extend through the layer of silicon/germanium and at least partially into the semiconducting substrate, wherein the trenches define a fin structure for the device comprised of a portion of the substrate and a portion of the layer of silicon/germanium, the portion of the layer of silicon/germanium having a first cross-sectional configuration, forming a layer of insulating material in the trenches and above the fin structure, performing an anneal process on the device so as to cause the first cross-sectional configuration of the layer of silicon/germanium to change to a second cross-sectional configuration that is different from the first cross-sectional configuration, and forming a final gate structure around at least a portion of the layer of silicon/germanium having the second cross-sectional configuration.

34 Claims, 7 Drawing Sheets

(56) References Cited

U.S. PATENT DOCUMENTS

| | | |
|---|---|---|
| 2011/0097881 A1 | 4/2011 | Vandervorst et al. |
| 2011/0147697 A1 | 6/2011 | Shah et al. |
| 2011/0233522 A1 | 9/2011 | Cohen et al. |
| 2012/0037994 A1 | 2/2012 | Saitoh et al. |
| 2012/0126338 A1 | 5/2012 | Juengling |
| 2012/0261643 A1 | 10/2012 | Cohen et al. |
| 2012/0309173 A1 | 12/2012 | Shah et al. |
| 2013/0020707 A1 | 1/2013 | Or-Bach et al. |
| 2013/0065371 A1 | 3/2013 | Wei et al. |

OTHER PUBLICATIONS

Hur et al., "A Practical Si Nanowire Technology with Nanowire-on-Insulator structure for beyond 10nm Logic Technologies," IEDM13-649-652, 26.5.1-26.5.4, 2013.

Moon et al., "Investigation of Silicon Nanowire Gate-All-Around Junctionless Transistors Built on a Bulk Substrate," IEEE Transactions on Electron Devices, 60:1355-60, Apr. 2013.

Kuhn, "Peering into Moore's Crystal Ball: Transistor Scaling beyond the 15nm node," Int'l Symp. on Adv. Gate Stack Technology, Sep. 29, 2010.

\* cited by examiner

METHODS OF FORMING A SEMICONDUCTOR DEVICE WITH A NANOWIRE CHANNEL STRUCTURE BY PERFORMING AN ANNEAL PROCESS

BACKGROUND OF THE INVENTION

1. Field of the Invention

Generally, the present disclosure relates to the manufacture of sophisticated semiconductor devices, and, more specifically, to various methods of forming a three-dimensional (3D) semiconductor device having one or more nanowire channel structures by performing an anneal process.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, there are so-called 3D devices, such as an illustrative FinFET device, which is a three-dimensional structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive current than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

One process flow that is typically performed to form FinFET devices involves forming a plurality of trenches in the substrate to define the areas where STI regions will be formed and to define the initial structure of the fins, and these trenches are typically formed in the substrate during the same process operation for processing simplicity. In some cases, the trenches are desirably designed with the same pitch (for better resolution during lithography) and they are formed to the same depth and width (for processing simplicity), wherein the depth of the trenches is sufficient for the needed fin height and deep enough to allow formation of an effective STI region. In other cases, modern integrated circuit products may have multiple regions that each have different fin pitches. After the trenches are formed, a layer of insulating material, such as silicon dioxide, is formed so as to overfill the trenches. Thereafter, a chemical mechanical polishing (CMP) process is performed to planarize the upper surface of the insulating material with the top of the fins (or the top of a patterned hard mask). Thereafter, an etch-back process is performed to recess the layer of insulating material between the fins and thereby expose the upper portions of the fins, which corresponds to the final fin height of the fins.

In one particular prior art process flow, a layer of silicon/germanium (SiGe) having a germanium concentration of about 30% was formed above a silicon substrate. Thereafter, the trenches were formed to define the Si/SiGe fins. Then, a layer of silicon dioxide was formed in the trenches and above the fins. Typically, due to the high aspect ratio of the trenches found in modern devices, the silicon dioxide material selected for filling the trenches had to be a material that exhibited relatively good fill capabilities, frequently, a silicon dioxide material made using a so-called HARP (High Aspect Ratio) process available from Applied Materials. In general, the HARP process employs an ozone-TEOS process chemistry to produce what will be referred to as "HARP silicon dioxide." Other higher quality oxides, like oxides made using the well-known HDP (High Density Plasma) process, did not exhibit the necessary fill capabilities for use on modern or future devices. Unfortunately, the HARP silicon dioxide material was of relatively poor quality as it contained a relatively high amount of dangling bonds and OH groups that, upon heating, form water molecules. Thus, when the trenches were filled with a HARP silicon dioxide material, an anneal process was performed on the devices in an attempt to improve the quality of the HARP silicon dioxide, e.g., an attempt was made to drive off moisture, eliminate pinholes, etc. Typically, a relatively long anneal was then performed on the device, e.g., about 1050° C. for a duration of about 30 minutes in a traditional furnace with a nitrogen ambient. The relatively long anneal process effectively bakes out the water and other species in the layer of HARP silicon dioxide and otherwise passivates the bonds such that the layer of HARP silicon dioxide is not conductive (so as to reduce or eliminate leakage currents). In some cases, a spike anneal of about 1050° C. may have been performed on such a device in a room-air ambient with the 30% germanium concentration for the same purposes, but such a spike anneal was not as effective in reducing undesirable leakage currents.

Device manufacturers are under constant pressure to produce integrated circuit products with increased performance and lower production cost relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance capability and reliability of such devices.

The present disclosure is directed to various methods of forming a three-dimensional (3D) semiconductor device having one or more nanowire channel structures.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a three-dimensional (3D) semiconductor device having one or more nanowire channel structures by performing an anneal process. One illustrative method disclosed herein includes forming a layer of silicon/germanium on a semiconducting substrate, wherein the layer of silicon/2162.222100 germanium has a germanium concentration of at least 30%, forming a plurality of spaced-apart trenches that extend through the layer of silicon/germanium and at least partially into the semiconducting substrate, wherein the trenches define a fin structure for the device comprised of a portion of the substrate and a portion of the layer of silicon/germanium, the portion of the layer of silicon/germanium having a first cross-sectional configuration, forming a layer of insulating material in the trenches and above the fin structure, wherein, after formation, the layer of insulating material comprises an oxidizing species, performing an anneal process on the device so as to cause the first cross-sectional configuration of the portion of the layer of silicon/germanium to change to a second cross-sectional configuration that is different from the first cross-sectional configuration, and forming a final gate structure around at least a portion of the portion of the layer of silicon/germanium having the second cross-sectional configuration.

Another illustrative method disclosed herein includes forming a layer of silicon/germanium on a semiconducting substrate, wherein the layer of silicon/germanium has a germanium concentration of at least 30%, forming a plurality of spaced-apart trenches that extend through the layer of silicon/germanium and at least partially into the semiconducting substrate, wherein the trenches define a fin structure for the device comprised of a portion of the substrate and a portion of the layer of silicon/germanium, the portion of the layer of silicon/germanium having a first cross-sectional configuration, forming a layer of silicon dioxide in the trenches and above the fin structure, wherein, after formation, the layer of silicon dioxide comprises silanol (SiOH), performing an anneal process on the device in a non-oxidizing process ambient so as to cause the first cross-sectional configuration of the portion of the layer of silicon/germanium to change to a second cross-sectional configuration that is different from the first cross-sectional configuration, and forming a final gate structure around at least a portion of the portion of the layer of silicon/germanium having the second cross-sectional configuration.

BRIEF DESCRIPTION OF THE DRAWINGS

The disclosure may be understood by reference to the following description taken in conjunction with the accompanying drawings, in which like reference numerals identify like elements, and in which.

Figure 1A:
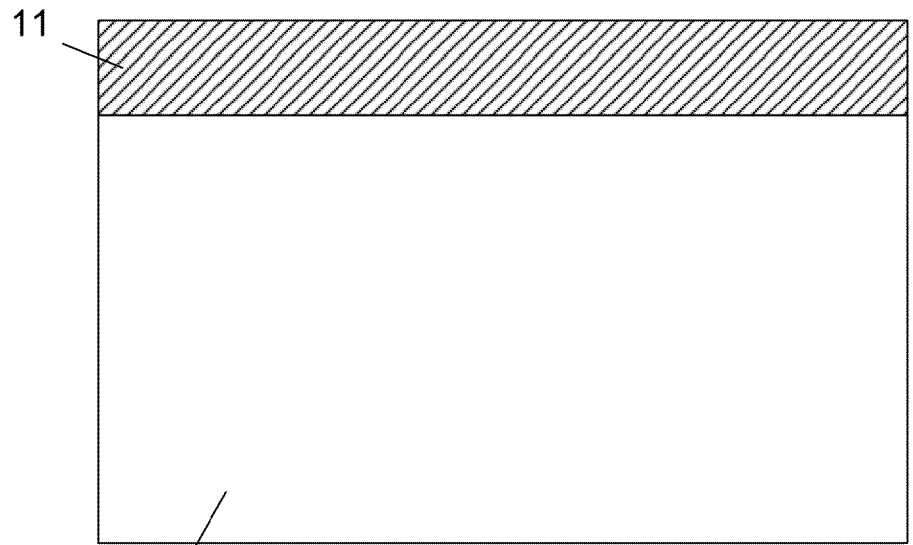
FIGS. 1A-1G depict various illustrative methods disclosed herein for forming a three-dimensional (3D) semiconductor device having one or more nanowire channel structures by performing an anneal process.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a three-dimensional (3D) semiconductor device having one or more nanowire channel structures by performing an anneal process. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

FIG. 1A is a simplified view of an illustrative nanowire device structure 100 at an early stage of manufacturing that is formed above a semiconductor substrate 10. In the depicted example, the nanowire device structure 100 will be disclosed in the context of using FinFET formation techniques to form the nanowire device 100. However, the present invention should not be considered to be limited to the illustrative examples depicted herein. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. The substrate 10 may also have a silicon/germanium-on-insulator (SGOI) configuration as well. Thus, the terms "substrate" or "semiconductor substrate" should be understood to cover all semiconductor structures. The substrate 10 may also be made of materials other than silicon. An illustrative trench isolation structure (not shown) may be formed in the substrate 10 to define an active region where the device 100 will be formed. Of course, as will be recognized by those skilled in the art after a complete reading of the present application, the isolation structure can be formed before or after various fins (described below) are formed in the substrate 10.

In general, the present disclosure is directed to forming a 3D device wherein the channel structure is comprised of one or more nanowires. In one example described herein, a single nanowire structured is formed above each of the illustrative fins. However, after a complete reading of the present application, those skilled in the art will appreciate that the channel structure may be comprised of any desired number of such nanowire structures. Thus, the inventions disclosed herein should not be considered as being limited to a device with any particular number of such nanowire channel structures.

At the point of fabrication depicted in FIG. 1A, a layer of silicon/germanium 11 having a germanium concentration of at least 30% has been formed on the substrate 10 by performing an epitaxial deposition process. In some cases, the germanium concentration in the layer of silicon/germanium 11 may fall within the range of about 30-100%, and, in a particular example, the germanium concentration may be at least 50%. The germanium concentration in the layer of silicon/germanium 11 may be controlled during the epitaxial deposition process using techniques known to those skilled in the art. In one illustrative embodiment, the layer of silicon/germanium 11 may have a thickness of about 20-30 nm, although its thickness may vary depending upon the particular application and the germanium concentration. In some applications, discussed further below, multiple layers of silicon/germanium 11 may be formed above the substrate 10. In that case, each of the layers of silicon/germanium 11 may have the same thickness or their thicknesses may vary.

Figure 1B:
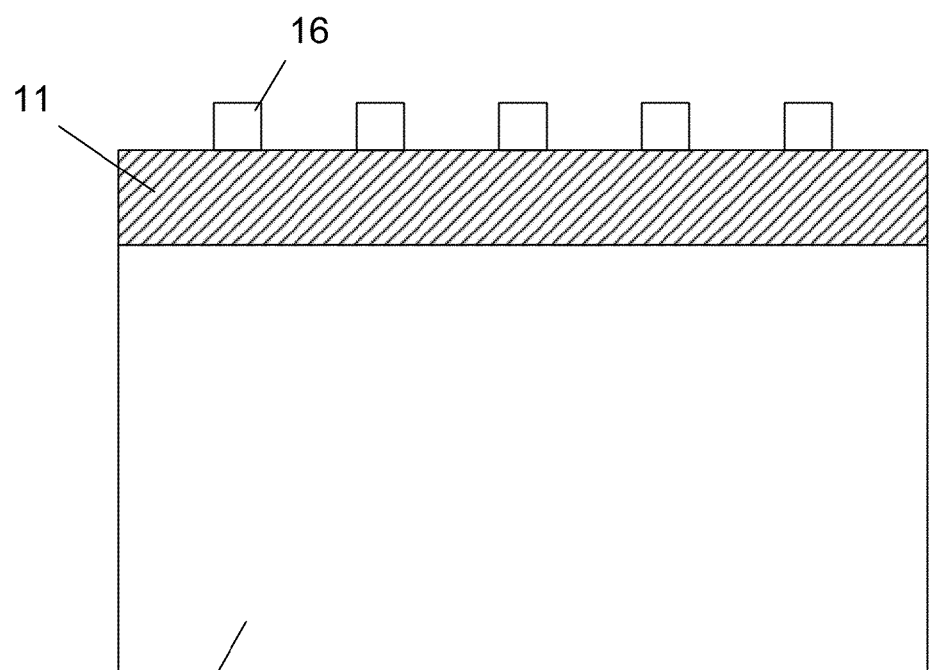

FIG. 1B depicts the device 100 after a patterned mask layer 16, such as a patterned hard mask layer, has been formed above the layer of silicon/germanium 11 using known photolithography and etching techniques. The patterned mask layer 16 is intended to be representative in nature as it could be comprised of a variety of materials, such as, for example, a photoresist material, silicon nitride, silicon oxynitride, silicon dioxide, etc. Moreover, the patterned mask layer 16 could be comprised of multiple layers of material, such as, for example, a pad oxide layer (not shown) that is formed on the layer of silicon/germanium 11 and a silicon nitride layer (not shown) that is formed on the pad oxide layer. Thus, the particular form and composition of the patterned mask layer 16 and the manner in which it is made should not be considered a limitation of the present invention. In the case where the patterned mask layer 16 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application. In one illustrative embodiment, the patterned mask layer 16 is a hard mask layer of silicon nitride that is initially formed by performing a CVD process to deposit a layer of silicon nitride and thereafter patterning the layer of silicon nitride using known sidewall image transfer techniques and/or photolithographic techniques combined with performing known etching techniques.

Figure 1C:
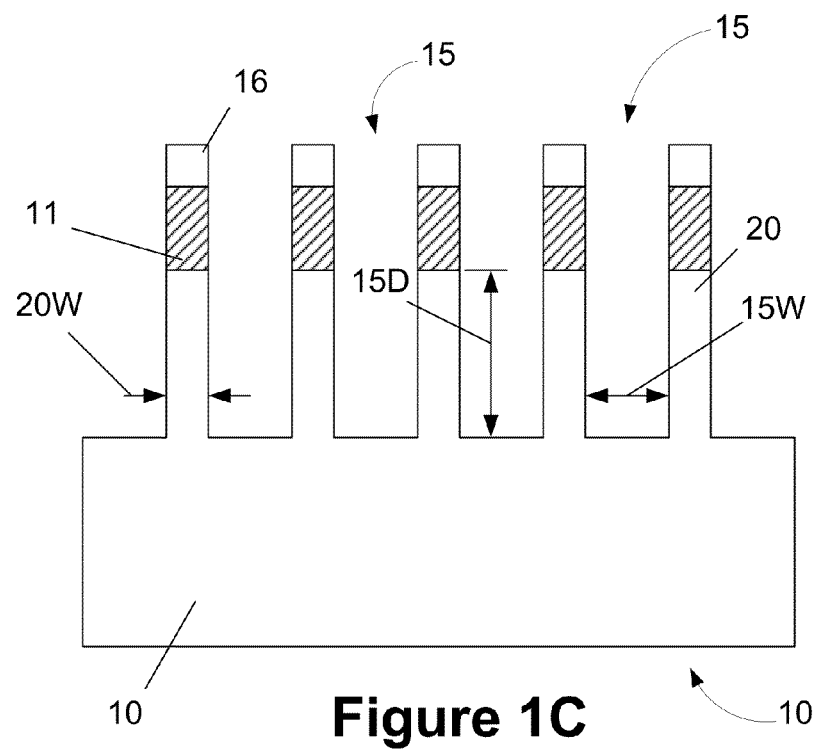

Next, as shown in FIG. 1C, one or more dry or wet etching processes are performed on the layer of silicon/germanium 11 and on the substrate 10 through the patterned mask layer 16 to form a plurality of trenches 15. This etching process results in the definition of a plurality of fin structures 20 that are each comprised of a portion of the substrate 10 and a portion of the layer of silicon/germanium 11. The overall size, shape and configuration of the trenches 15 and the fin structures 20 may vary depending on the particular application. The depth 15D and width 15W of the trenches 15 may vary depending upon the particular application. In one illustrative embodiment, based on current day technology, the depth 15D of the trenches 15 may range from approximately 100-350 nm and the width 15W of the trenches 15 may range from about 15-80 nm. The trenches 15 may have a relatively high aspect ratio (depth/width), e.g., about 5 or greater. In some embodiments, the fin structure 20 may have a width 20W within the range of about 7-30 nm. In the illustrative example depicted in the attached figures, the trenches 15 and the fin structures 20 are all of a uniform size and shape. However, as discussed more fully below, such uniformity in the size and shape of the trenches 15 and the fin structures 20 is not required to practice at least some aspects of the inventions disclosed herein. In the example depicted herein, the trenches 15 are formed by performing a plurality of anisotropic etching processes that result in the trenches 15 having a schematically depicted, generally rectangular configuration. In an actual real-world device, the sidewalls of the trenches 15 may be somewhat inwardly tapered, although that configuration is not depicted in the drawings. In some cases, the trenches 15 may have a reentrant profile near the bottom of the trenches 15. To the extent the trenches 15 are formed by performing a wet etching process, the trenches 15 may tend to have a more rounded configuration or non-linear configuration as compared to the generally rectangular configuration of the trenches 15 that are formed by performing an anisotropic etching process. Thus, the size and configuration of the trenches 15, and the manner in which they are made, should not be considered a limitation of the present invention. For ease of disclosure, only the substantially rectangular trenches 15 will be depicted in subsequent drawings.

Figure 1D:
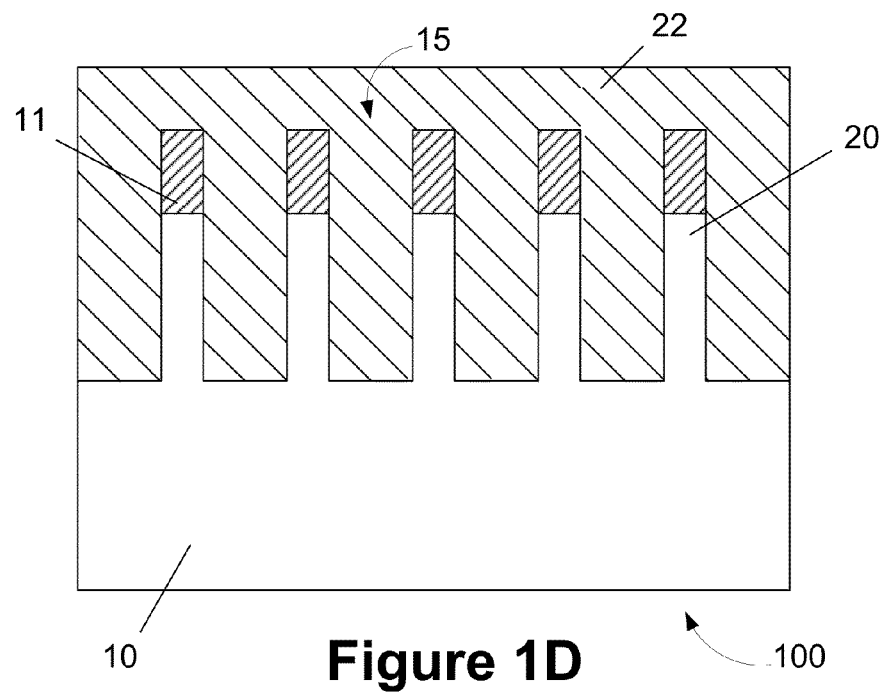

Next, as shown in FIG. 1D, a layer of insulating material 22 is formed in the trenches 15 of the device 100. In the depicted example, the mask layer 16 was removed prior to the formation of the layer of insulating material 22, but that may not be the case in all applications. The layer of insulating material 22 may be comprised of a variety of different materials, such as, for example, silicon dioxide, SiON, SiOCN, or multiple layers thereof, etc., and it may be formed by performing a variety of techniques, e.g., CVD, ALD, etc. In one particularly illustrative embodiment, the first layer of insulating material 22 may be a silicon dioxide material made using a so-called HARP (High Aspect Ratio) process available from Applied Materials. In general, the HARP process employs an ozone-TEOS process chemistry to produce what will be referred to in this specification and in the claims as a "HARP silicon dioxide." As depicted, the layer of insulating material 22 is typically deposited such that it overfills the trenches 15 and encapsulates the fin structures 20. In one particular example, the layer of insulating material 22 may be a HARP silicon dioxide material that formed at a temperature of about 540° C. using TEOS as a precursor. In general, the layer of insulating material 22 is a made of a material such that, post-deposition, it contains free oxygen or one or more loosely bound oxidizing species. For example, in the case where the layer of insulating material is made of silicon dioxide, the oxidizing species may be silanol (Si—OH) that is present in the layer 22. In this example, the Si—OH bond is weaker than the $SiO_2$ bonds. As described more fully below, the oxygen portion of the oxidizing species may be liberated during an anneal process that is performed to form the nanowire structures disclosed herein.

Figure 1E:
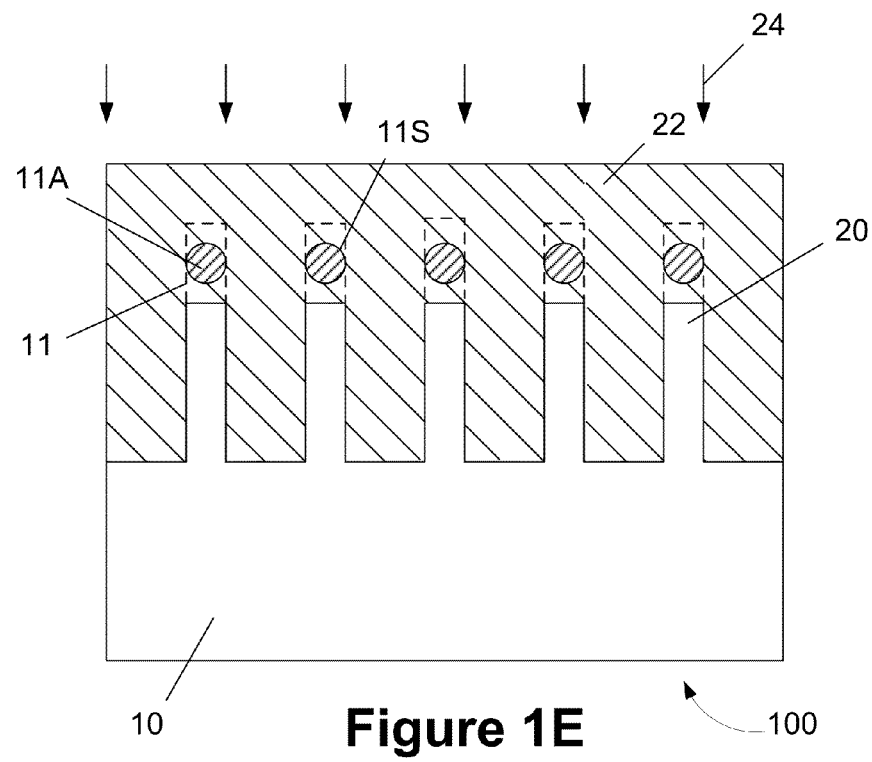

FIG. 1E depicts the device 100 after an anneal process 24, e.g., a rapid thermal anneal process or a furnace anneal process, has been performed on the device 100 with the fin structures 20 encapsulated by the layer of insulating material 22. In one illustrative embodiment, the anneal process 24 may be a rapid thermal anneal process performed at a minimum starting temperature of about 23° C., at a heating rate within the range of about 1-100° C./sec, and, in one particular embodiment, the anneal process 24 may be performed with a heating rate of about 75° C./sec. The anneal process 24 may be performed at a pressure that falls within the range of 740-780 Torr and it may be performed for a duration of about a few seconds to about 300 seconds. In one particular embodiment, the anneal process 24 may be performed using an initial temperature of about 23° C. that is ramped a heating rate that falls within the range of about 50-100° C./sec, and, in one very particular embodiment, about 75° C./sec, until a final temperature of about 1050° C. is reached. The anneal process 24 may be performed in any type process tool capable of performing such a heating process, e.g., a rapid thermal annealing chamber, a furnace. In the case of a furnace anneal process, the anneal may be performed for longer periods of time using lower temperature ramp rates, e.g., ramp rates on the order of 1-10° C./min may be employed when performing a furnace based anneal process. In one embodiment, the anneal process 24 is performed in a non-oxidizing process ambient comprised of an inert gas, such as nitrogen, hydrogen, argon, or helium. After the anneal process 24 is completed, the device 100 is allowed to cool to room temperature without any attempt being made to control the cooling of the device 100. During this anneal process 24, the post-etch cross-sectional configuration of the portions of the layer of silicon/germanium 11, i.e., the approximate rectangular cross-sectional configuration depicted by dashed lines 11 in FIG. 1E, changes. More specifically, in one illustrative embodiment, the anneal process 24 results in the formation of illustrative nanowires 11A that have a cross-sectional configuration that is different than the post-etch cross-sectional configuration of the portions of the layer of silicon/germanium. More specifically, in the depicted example, the silicon/germanium material has a post-anneal cross-sectional configuration that is substantially rod-like or circular. Note that the generally circular cross-sectional post-anneal configuration of the nanowires 11A need not be a perfect geometric form, and all of the portions of the layer of silicon/germanium 11 subjected to the anneal process 24 need not have the exact same post-anneal cross-sectional configuration. For example, while the nanowire 11A has a generally circular post-anneal cross-sectional configuration, it may also have other post-anneal configurations, e.g., a generally elliptical cross-sectional configuration. In one particular embodiment, the anneal process 24 causes the formation of nanowires 11A that have a post-anneal configuration that may permit the entire exterior surface 11S of the nanowire structures 11A to be accessed so that a gate structure may be formed around the entire exterior surface 11S of the nanowire 11A. The ends of the nanowire structures 11A are anchored to portions of the substrate that are not depicted in the plane of the drawing figures. In some cases, the nanowire structures 11A may be formed prior to the formation of a trench isolation region around the device.

Figure 1F:
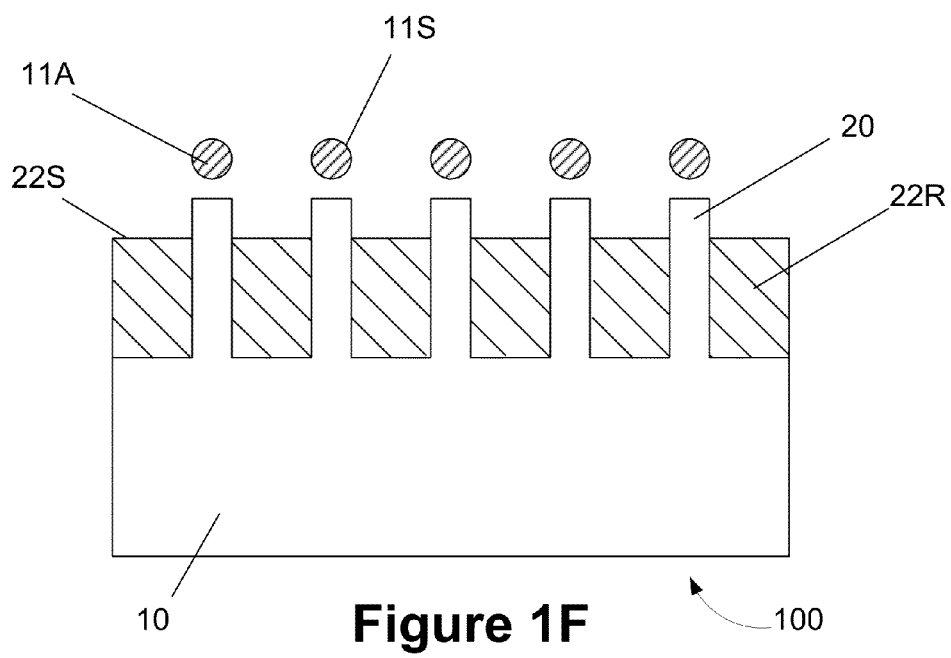

FIG. 1F depicts the device 100 after the anneal process 24 has been completed and after additional process operations have been performed on the device. More specifically, at the point of fabrication depicted in FIG. 1F, a chemical mechanical polishing (CMP) process was performed to planarize the upper surface of the layer of insulating material 22 and one or more etching processes were performed on the layer of insulating material 22 to reduce its overall thickness and thereby define a reduced thickness layer of insulating material 22R. The etching process may be either a wet or dry etching process. The final thickness of the reduced thickness layer of insulating material 22R may vary depending upon the particular application, e.g., it may have a reduced thickness of about 20-200 nm. The upper surface 22S of the reduced thickness layer of insulating material 22R effectively defines the final fin height for the device 100.

Figure 1G:
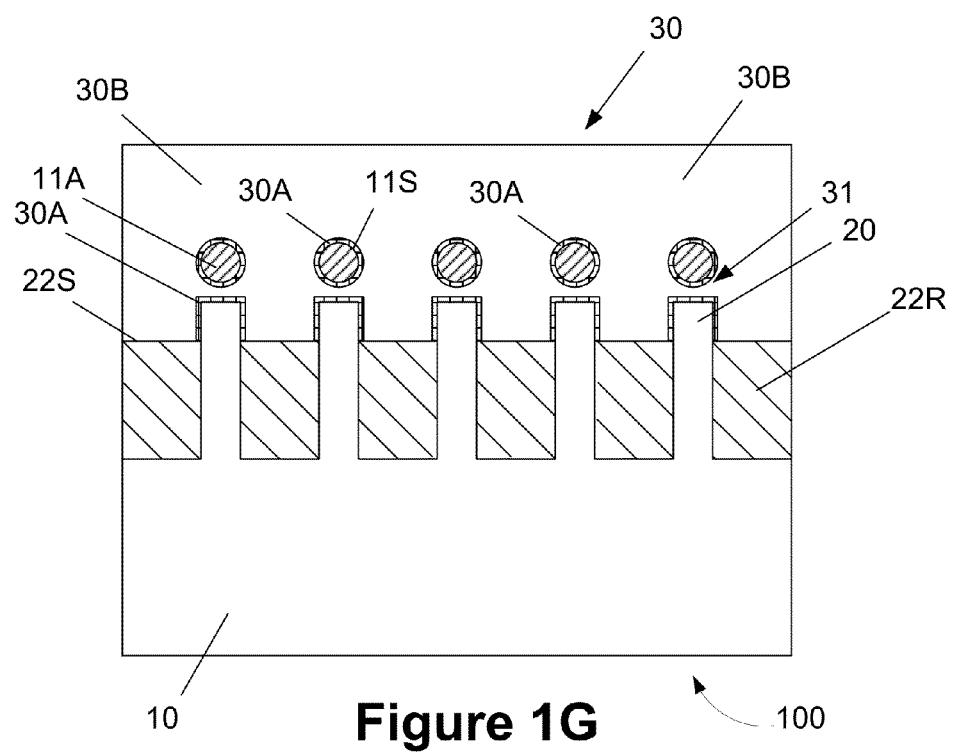

Next, as shown in FIG. 1G, a final gate structure 30 is formed on the device 100 using well-known techniques. In one illustrative embodiment, the schematically depicted gate structure 30 includes an illustrative gate insulation layer 30A and an illustrative gate electrode 30B. An illustrative gate cap layer (not shown) may also be formed above the illustrative gate electrode 30B. The gate insulation layer 30A may be comprised of a variety of different materials, such as, for example, silicon dioxide, a so-called high-k (k greater than 10) insulation material (where k is the relative dielectric constant), etc. The thickness of the gate insulation layer 30A may also vary depending upon the particular application, e.g., it may have a thickness of about 1-2 nm. In some applications, the thickness of the gate insulation layer 30A is such that it does not completely fill the gap 31 between the nanowires 11A and the underlying portions of the silicon fins 20. Similarly, the gate electrode 30B may also be of a variety of conductive materials, such as polysilicon or amorphous silicon, or it may be comprised of one or more metal layers that act as the gate electrode 30B. As will be recognized by those skilled in the art after a complete reading of the present application, the gate structure 30 of the device 100 depicted in the drawings, i.e., the gate insulation layer 30A and the gate electrode 30B, is intended to be representative in nature. That is, the gate structure 30 may be comprised of a variety of different materials and it may have a variety of configurations. In one illustrative embodiment, a thermal oxidation process may be performed to form a gate insulation layer 30A comprised of silicon dioxide. Thereafter, the gate electrode material 30B and the gate cap layer material (not shown) may be deposited above the device 100 and the layers may be patterned using known photolithographic and etching techniques. In another illustrative embodiment, a conformal CVD or ALD process may be performed to form a gate insulation layer 30A comprised of hafnium oxide. Thereafter, one or more metal layers (that will become the gate electrode 30B) and a gate cap layer material (not shown), e.g., silicon nitride, may be deposited above the device 100.

At this point, traditional manufacturing techniques may be performed to complete the manufacture of the device 100. For example, sidewall spacers (not shown) comprised of, for example, silicon nitride, may be formed adjacent the final gate structure 30. After the spacers are formed, if desired, an epitaxial growth process may be performed to form additional semiconducting material (not shown) on the portions of the nanowires 11A positioned outside of the spacers. Additional contacts and metallization layers may then be formed above the device using traditional techniques.

Figure 2:
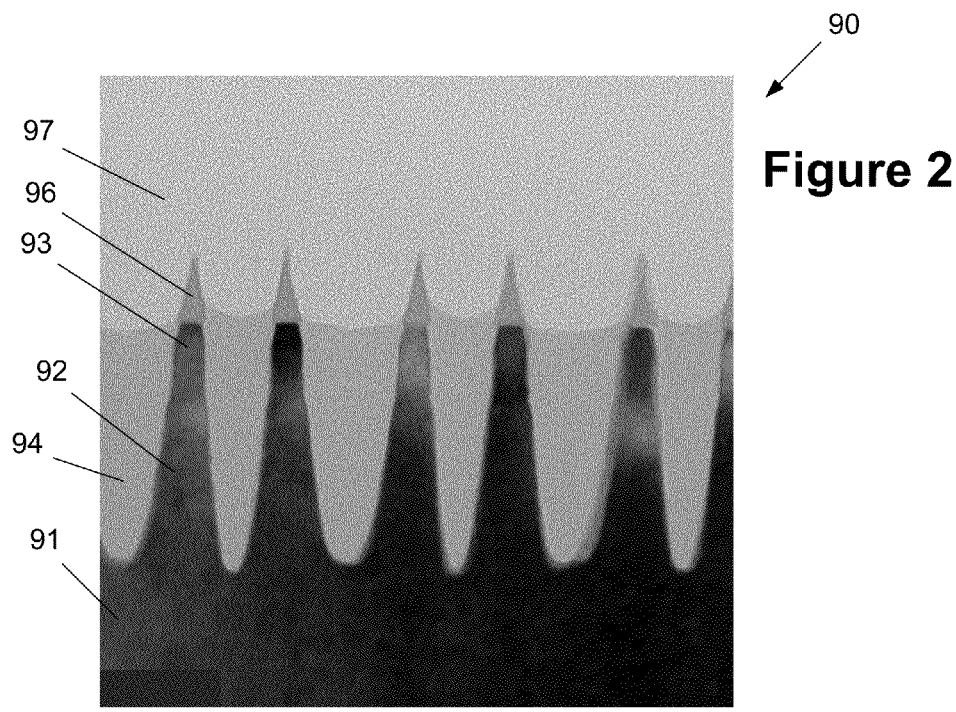
FIG. 2 is an SEM photograph of an illustrative FinFET device.
Figure 3:
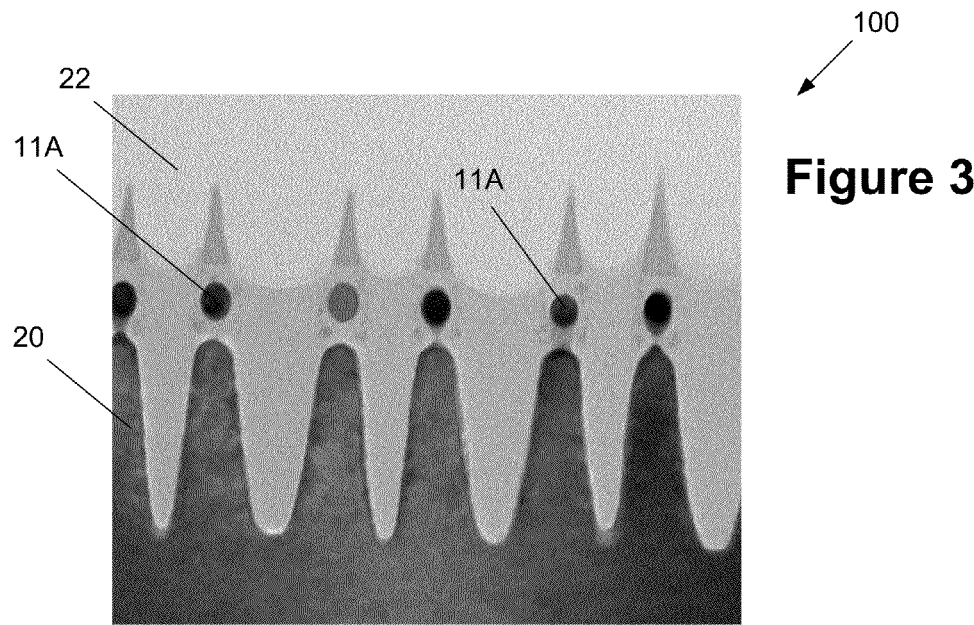
FIG. 3 is an SEM photograph of an illustrative FinFET device having the nanowire structures that were formed as described herein.

FIGS. 2 and 3 are SEM photographs of devices that are provided to show the results obtained using the novel methods disclosed herein based upon the concentration of germanium in the layer of silicon/germanium 11 and performing the rapid anneal process 24 in a non-oxidizing process ambient. The germanium concentration in the layer of silicon/germanium 11 formed on the FinFET devices 90, 100 is about 25% and 50%, respectively. As shown in FIG. 2, the device 90 is comprised of a silicon substrate 91, a silicon fin 92, a silicon/germanium fin portion 93 (wherein the germanium concentration is about 25%), a layer of HARP silicon dioxide 94, a silicon nitride hard mask 96 and a layer of TEM prep coating material 97. The device 100 shown in FIG. 3 has the same basic structure as the device shown in FIG. 2, except that, as noted above, the germanium concentration in the silicon germanium fin portion (11A in FIG. 3) is about 50% as compared to about 25% for the silicon/germanium fin portion 93 for the device 90 shown in FIG. 2. Both of the devices 90, 100 were subjected to the same rapid thermal anneal process, i.e., beginning at an initial temperature of about room temperature, the devices were heated at a heating rate of about 75° C./sec to a temperature of about 1050° C., at a pressure of about 760 Torr for a total duration of about 14 seconds in a non-oxidizing process ambient comprised of nitrogen. Thereafter, the devices were allowed to cool to room temperature, without any effort to control the rate of cooling. As can be seen by comparing FIGS. 2 and 3, the nanowire structures did not form on the device 90, i.e., the device where the germanium concentration was about 25%, but the nanowires 11A did form on the device 100, i.e., the device where the germanium concentration was about 50%. The fact that such nanowire structures 11A resulted from such a relatively mild spike anneal process when performed in a non-oxidizing process ambient was both surprising and unexpected. It is believed that such nanowire structures 11A were achieved because the oxidation rate of silicon/germanium is dependent upon the percentage of germanium in the silicon/germanium material and it is known to increase rapidly as the germanium percentage increases. It is believed that the oxidizing species (silanol (Si—OH)) remaining in the HARP silicon dioxide material absorbs water from external sources and, upon sufficient heating, will undergo a condensation reaction to produce water (SiOH+SiOH→SiOSi+$H_2O$). Thus, it is believed that water ($H_2O$) is the likely oxidizing species that reacts with the silicon material in the silicon/germanium layer 11 to form the nanowires 11A. A further experiment was conducted on a similar device where the concentration of germanium was about 50%. In that case, a spike anneal process was performed in a nitrogen ambient wherein the device was heated from a beginning temperature of about room temperature at a heating rate of about 75° C./sec to a lower temperature of about 650° C. and allowed to cool without any control as to the rate of cooling. The duration of the anneal process was about 8.3 seconds. The inventors demonstrated that the silicon/germanium fin portions were beginning to oxidize when subjected to this lower temperature anneal, i.e., the silicon/germanium fin portions were beginning the process of becoming the nanowire structures 11A at temperatures as low as about 650° C. when the anneal process was performed in a non-oxidizing ambient.

Figure 4A:
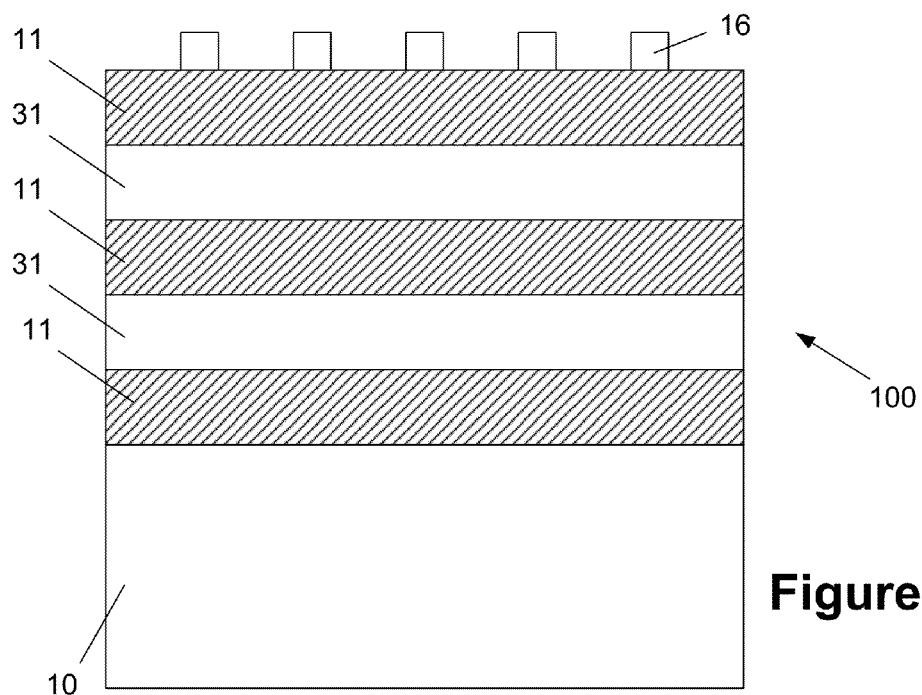
FIGS. 4A-4D depict yet another illustrative novel method and device disclosed herein.

FIGS. 4A-4D depict another illustrative example of a novel method for forming a 3D device 100. In this embodiment, the device 100 may be comprised of multiple levels of nanowire structures 11A that may be layered between layers of other semiconductor materials, such as silicon. As shown in FIG. 4A, the process beings with the formation of multiple layers of silicon/germanium 11 and multiple layers of another semiconductor material 31, e.g., silicon, above the substrate 10. The layers of silicon/germanium each have a germanium concentration of at least 30%, and they are each formed by performing an epitaxial deposition process. In some cases, the germanium concentration in the layers of silicon/germanium 11 shown in FIG. 4A may fall within the range of about 30-100%, and the germanium concentration of the individual layers of silicon/germanium may be the same or they may be different. The germanium concentration in the layer of silicon/germanium 11 may be controlled during the epitaxial deposition process. In one illustrative embodiment, each of the layers of silicon/germanium 11 may have a thickness of about 10-40 nm. In some applications, each of the layers of silicon/germanium 11 may have the same thickness or their thicknesses may vary. Similarly, the thicknesses of the layers of semiconducting material 31 may vary depending upon the particular application, e.g., 10-50 nm, and all of the layers 31 may have the same or different thicknesses, and the composition ranges from about 0-25%. The layers of semiconducting material may also be formed by performing an epitaxial deposition process. Also depicted in FIG. 4A is the previously-described patterned mask layer 16.

Figure 4B:
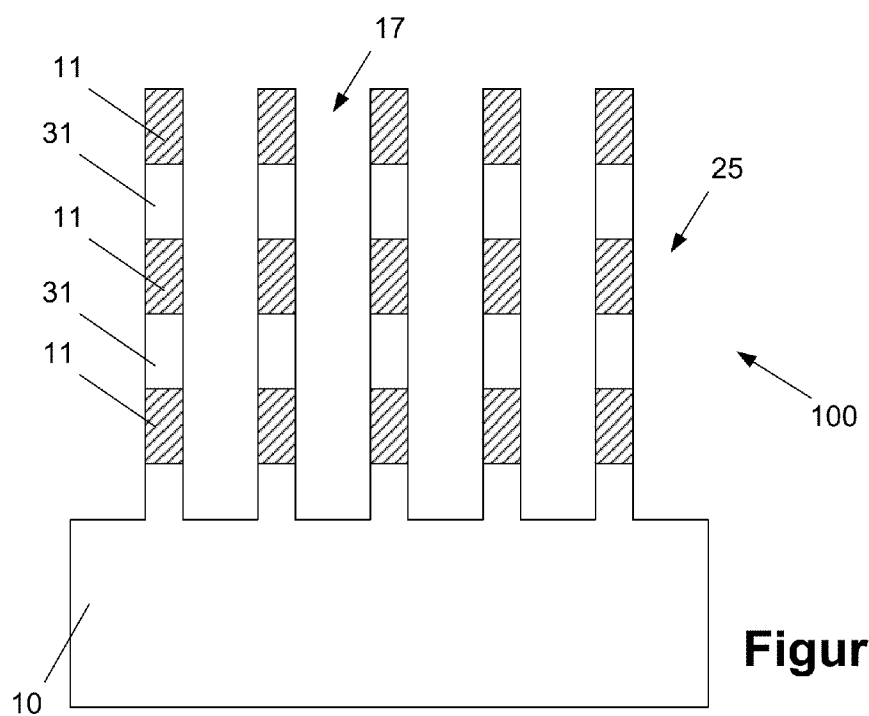

Next, as shown in FIG. 4B, one or more dry or wet etching processes are performed on the layers of silicon/germanium 11, the layers of semiconducting material 31 and on the substrate 10 through the patterned mask layer 16 to form a plurality of trenches 17. This etching process results in the definition of a plurality of fin structures 25 that are each comprised of a portion of the substrate 10, portions of each of the multiple layers of silicon/germanium 11 and portions of each of the multiple layers of the semiconducting material 31. The overall size, shape and configuration of the trenches 17 and the fin structures 25 may vary depending on the particular application.

Figure 4C:
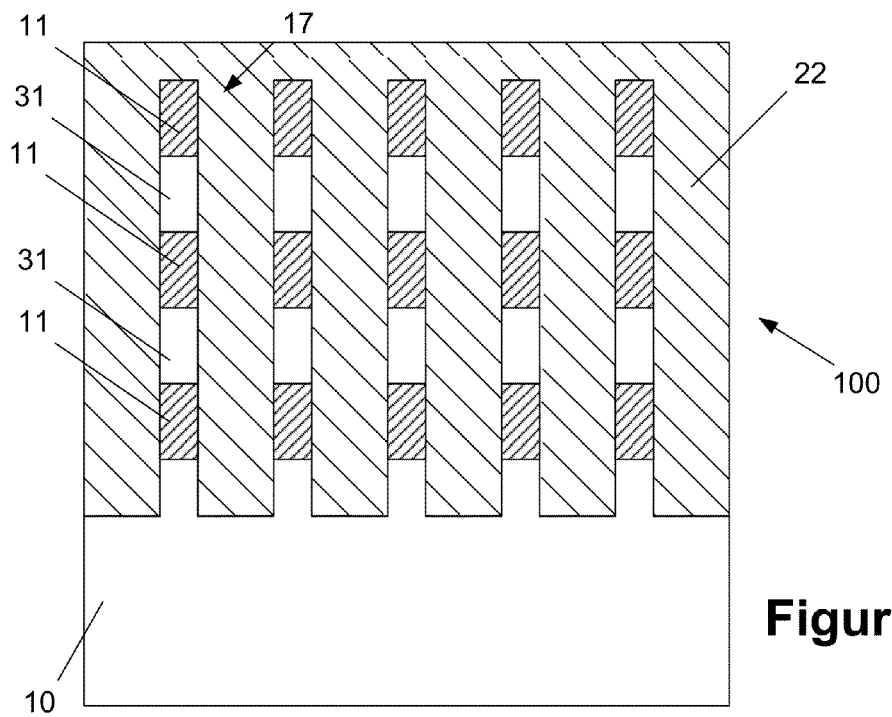

FIG. 4C depicts the device 100 after the layer of insulating material 22 is formed in the trenches 17 of the device 100. As depicted, the layer of insulating material 22 is typically deposited such that it overfills the trenches 17.

Figure 4D:
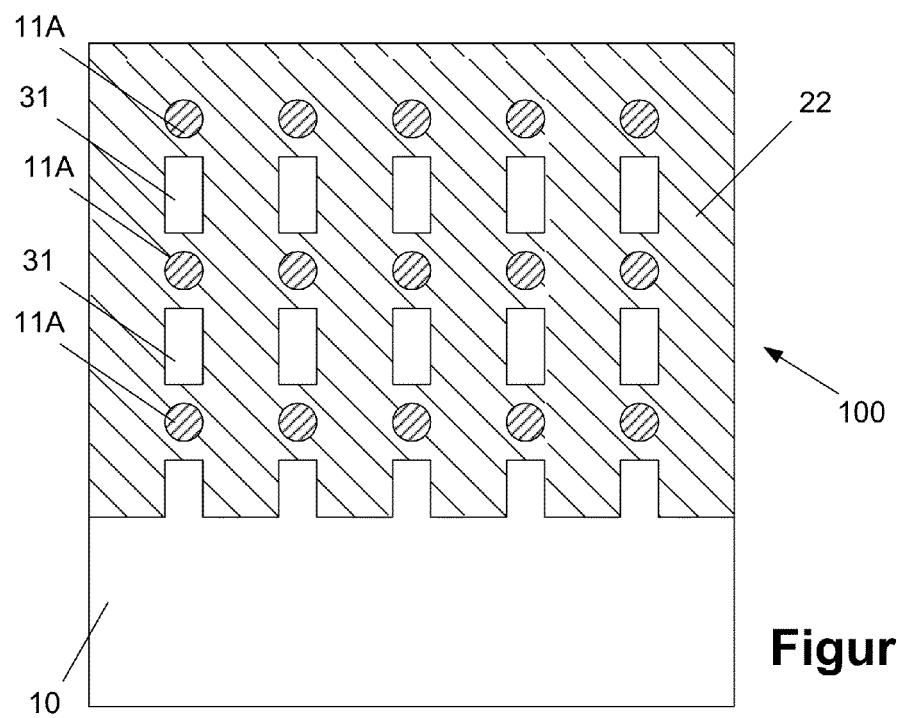

FIG. 4D depicts the device 100 after the previously described rapid anneal process 24 (FIG. 1E) has been performed on the device 100. As with the previous example, during the rapid anneal process 24, the original, as-formed substantially cross-sectional configuration of the portions of the layers of silicon/germanium 11 change shape, i.e., the anneal process 24 results in the formation of illustrative nanowires 11A that have a substantially rod-like or circular cross-sectional configuration. At the point of fabrication depicted in FIG. 4D, additional process operations (as previously described) are performed to form the final gate structure 30 (not shown) on the device 100. Thereafter, traditional manufacturing techniques may be performed to complete the manufacture of the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a device, comprising:
   forming a layer of silicon/germanium on a semiconductor substrate, said layer of silicon/germanium having a germanium concentration of at least 30%;
   forming a plurality of spaced-apart trenches that extend through said layer of silicon/germanium and at least partially into said semiconducting substrate, said trenches defining a fin structure for said device comprised of a portion of said semiconductor substrate and a portion of said layer of silicon/germanium, said portion of said layer of silicon/germanium having a first cross-sectional configuration;
   forming a layer of insulating material in said trenches and above said fin structure, wherein, after formation, said layer of insulating material comprises an oxidizing species;
   performing an anneal process on said device so as to cause said first cross-sectional configuration of said portion of said layer of silicon/germanium to change to a second cross-sectional configuration that is different from said first cross-sectional configuration; and
   forming a final gate structure around at least a portion of said portion of said layer of silicon/germanium having said second cross-sectional configuration.

2. The method of claim 1, wherein said semiconductor substrate is comprised of silicon.

3. The method of claim 1, wherein said final gate structure comprises a gate insulation layer comprised of a high-k insulating material and a gate electrode comprised of at least one layer of metal.

4. The method of claim 1, wherein said final gate structure comprises a gate insulation layer comprised of silicon dioxide and a gate electrode comprised of polysilicon.

5. The method of claim 3, wherein said gate insulation layer is positioned on an entire exterior surface of said portion of said silicon/germanium having said second cross-sectional configuration.

6. The method of claim 4, wherein said gate insulation layer is positioned on an entire exterior surface of said portion of said silicon/germanium having said second cross-sectional configuration.

7. The method of claim 1, wherein said first cross-sectional configuration of said portion of said layer of silicon/germanium is substantially rectangular and said second cross-sectional configuration of said portion of said layer of silicon/germanium is substantially circular.

8. The method of claim 1, wherein performing said anneal process comprises performing a rapid thermal anneal process with a temperature rate increase that falls within the range of about 50-100° C./sec for at least a portion of said rapid thermal anneal process.

9. The method of claim 1, wherein performing said anneal process comprises performing a furnace anneal process with a temperature rate increase that falls within the range of about 1-10° C./min for at least a portion of said furnace anneal process.

10. The method of claim 1, wherein performing said anneal process comprises performing a rapid thermal anneal process with a temperature rate increase of about 75° C./sec for at least a portion of said rapid thermal anneal process and at a pressure that falls within the range of 740-780 Torr.

11. The method of claim 1, wherein said layer of silicon/germanium has a germanium concentration of at least 30-100%.

12. The method of claim 1, wherein said layer of insulating material is a HARP silicon dioxide material.

13. The method of claim 1, wherein said oxidizing species is silanol (SiOH).

14. The method of claim 1, wherein said layer of silicon/germanium has a germanium concentration of at least 50%, wherein said layer of insulating material is a HARP silicon dioxide, and wherein said anneal process is a rapid thermal anneal process performed with a temperature rate increase that falls within the range of about 50-100° C./sec for at least a portion of said anneal process.

15. The method of claim 1, wherein performing said anneal process on said device comprises performing a rapid thermal anneal process at a temperature of at least 650° C. for a duration falling within the range of about 1-300 seconds.

16. The method of claim 1, wherein said anneal process is performed in a non-oxidizing process ambient.

17. The method of claim 1, wherein said trenches have an aspect ratio of 5 or greater.

18. The method of claim 1, wherein said portion of said layer of silicon/germanium having said second cross-sectional configuration defines at least one nanowire structure.

19. The method of claim 1, wherein said portion of said layer of silicon/germanium having said second cross-sectional configuration defines a plurality of individual nanowire structures.

20. A method of forming a device, comprising:
   forming a layer of silicon/germanium on a semiconductor substrate, said layer of silicon/germanium having a germanium concentration of at least 30%;
   forming a plurality of spaced-apart trenches that extend through said layer of silicon/germanium and at least partially into said semiconducting substrate, said trenches defining a fin structure for said device comprised of a portion of said semiconductor substrate and a portion of said layer of silicon/germanium, said portion of said layer of silicon/germanium having a first cross-sectional configuration;
   forming a layer of insulating material comprised of silicon dioxide in said trenches and above said fin structure, wherein, after formation, said layer of insulating material comprises silanol (SiOH);

performing an anneal process on said device in a non-oxidizing process ambient so as to cause said first cross-sectional configuration of said portion of said layer of silicon/germanium to change to a second cross-sectional configuration that is different from said first cross-sectional configuration; and forming a final gate structure around at least a portion of said portion of said layer of silicon/germanium having said second cross-sectional configuration.

21. The method of claim 20, wherein said first cross-sectional configuration of said portion of said layer of silicon/germanium is substantially rectangular and said second cross-sectional configuration of said portion of said layer of silicon/germanium is substantially circular.

22. The method of claim 20, wherein performing said anneal process comprises performing a rapid thermal anneal process with a temperature rate increase that falls within the range of about 50-100° C./sec for at least a portion of said rapid thermal anneal process.

23. The method of claim 20, wherein performing said anneal process comprises performing a furnace anneal process with a temperature rate increase that falls within the range of about 1-10° C./min for at least a portion of said furnace anneal process.

24. The method of claim 20, wherein performing said anneal process comprises performing a rapid thermal anneal process with a temperature rate increase of about 75° C./sec for at least a portion of said rapid thermal anneal process and at a pressure that falls within the range of 740-780 Torr.

25. The method of claim 20, wherein said layer of silicon/germanium has a germanium concentration of at least 30-100%.

26. The method of claim 20, wherein said layer of insulating material is a HARP silicon dioxide material.

27. The method of claim 20, wherein said layer of silicon/germanium has a germanium concentration of at least 50%, wherein said layer of insulating material is a HARP silicon dioxide, and wherein said anneal process is a rapid thermal anneal process performed with a temperature rate increase that falls within the range of about 50-100° C./sec for at least a portion of said anneal process.

28. The method of claim 20, wherein performing said anneal process on said device comprises performing a rapid thermal anneal process at a temperature of at least 650° C. for a duration falling within the range of about 1-300 seconds.

29. The method of claim 20, wherein said trenches have an aspect ratio of 5 or greater.

30. A method of forming a device, comprising:

forming a layer of silicon/germanium on a semiconductor substrate, said layer of silicon/germanium having a germanium concentration of at least 50%;

forming a plurality of spaced-apart trenches that extend through said layer of silicon/germanium and at least partially into said semiconducting substrate, said trenches defining a fin structure for said device comprised of a portion of said semiconductor substrate and a portion of said layer of silicon/germanium, said portion of said layer of silicon/germanium having a first cross-sectional configuration;

forming a layer of insulating material comprised of silicon dioxide in said trenches and above said fin structure, wherein, after formation, said layer of insulating material comprises silanol (SiOH);

performing a rapid thermal anneal process on said device in a non-oxidizing process ambient so as to cause said first cross-sectional configuration of said portion of said layer of silicon/germanium to change to a second cross-sectional configuration that is different from said first cross-sectional configuration, said rapid thermal anneal process being performed with a temperature rate increase that falls within the range of about 50-100° C./sec for at least a portion of said rapid thermal anneal process; and forming a final gate structure around at least a portion of said portion of said layer of silicon/germanium having said second cross-sectional configuration.

31. The method of claim 30, wherein performing said rapid thermal anneal process is performed at a pressure that falls within the range of 740-780 Torr.

32. The method of claim 30, wherein said layer of silicon/germanium has a germanium concentration of at least 50-100%.

33. The method of claim 30, wherein said layer of insulating material is a HARP silicon dioxide material.

34. The method of claim 30, wherein said trenches have an aspect ratio of 5 or greater.

* * * * *